United States Patent [19]

Utsumi et al.

[11] Patent Number: 6,033,620

[45] Date of Patent: Mar. 7, 2000

[54] PROCESS OF PREPARING HIGH-DENSITY SINTERED ITO COMPACT AND SPUTTERING TARGET

[75] Inventors: Kentaro Utsumi; Toshiya Takahara, both of Kanagawa; Akio Kondo, Aichi; Osamu Matsunaga, Kanagawa, all of Japan

[73] Assignee: Tosoh Corporation, Japan

[21] Appl. No.: 08/631,992

[22] Filed: Apr. 15, 1996

[30] Foreign Application Priority Data

| Apr. 18, 1995 | [JP] | Japan | 7-092402 |
| Apr. 21, 1995 | [JP] | Japan | 7-096652 |
| May 11, 1995 | [JP] | Japan | 7-112937 |

[51] Int. Cl.$^7$ .................................................. C04B 35/457
[52] U.S. Cl. ............... 264/674; 204/298.12; 204/298.13; 501/126; 501/134
[58] Field of Search ............................ 204/298.12, 298.3; 501/126, 134; 264/674

[56] References Cited

U.S. PATENT DOCUMENTS

| 5,071,800 | 12/1991 | Iwamoto et al. ........................ 501/126 |
| 5,401,701 | 3/1995 | Ogawa et al. ....................... 204/298.13 |
| 5,433,901 | 7/1995 | Rancoule et al. ........................ 501/134 |
| 5,435,826 | 7/1995 | Sakakibara et al. ............... 204/298.13 |
| 5,700,419 | 12/1997 | Matsunaga et al. ..................... 264/674 |

FOREIGN PATENT DOCUMENTS

| 5-148636 | 6/1993 | Japan ............................... 204/298.13 |

*Primary Examiner*—James Derrington
*Attorney, Agent, or Firm*—Nixon & Vanderhye

[57] ABSTRACT

A sintered ITO compact is provided which is capable of retarding nodule formation, or particle generation. The sintered ITO compact is composed of In, Sn, and O, and has avelage length of void size of not larger than 0.7 $\mu$m. This sintered ITO compact is produced by sintering, substantially in an oxygen atmosphere, a green compact formed from a mixed powder of indium oxide power and tin oxide powder, the mixed powder containing the tin oxide powder at a content ranging from 5% to 15%, and the tin oxide powder having particles of a particle size of not more than 1 $\mu$m constituting not less than 90% portion thereof; or produced by sintering, in an oxygen atmosphere, a green compact formed from a mixed powder of indium oxide powder and tin oxide powder, the mixed powder having a tap density of not less than 1.8 g/cm$^3$, and the tin oxide powder having a maximum particle size of not larger than 1 $\mu$m and a median diameter of not larger than 0.4 $\mu$m.

2 Claims, No Drawings

PROCESS OF PREPARING HIGH-DENSITY SINTERED ITO COMPACT AND SPUTTERING TARGET

BACKGROUND OF THE INVENTION

1. Field of the Invention

The present invention relates to a high-density sintered ITO compact, and an ITO sputtering target for production of transparent electroconductive film, particularly to an ITO sputtering target without nodule formation.

2. Description of the Related Art

The thin film of ITO (indium tin oxide) has been widely used in a varieties of application fields such as display electrodes for a flat panel, soler cell windows, and antistatic films, because it has high electroconductivity and high transparency, and easily to fine photo lithgraph. The demand for the ITO thin film is increasing for pixel electrodes of flat panel displays such as a liquid crystal display which are intended for larger size and finer display quality.

The processes for ITO thin film formation are classified into chemical formation processes such as spray dry pyrolysis, and CVD, and physical formation processes such as electron beam evaporation, and sputtering. Of these processes, sputtering is employed in various application fields because of ease of producing a larger size of films having high performance.

In production of ITO thin film by sputtering, the sputtering target employed includes an alloy target composed of metallic indium and metallic tin (hereinafter referred to as an "IT target"), and a composite oxide target composed of indium oxide and tin oxide (hereinafter referred to as an "ITO target"). Of these targets, the ITO target is widely employed in ITO thin film production because of less variation with time of resistivity and transparency of the resulting film and ease of controlling film formation conditions in comparison with the IT target.

In continuous sputtering of the ITO target in an atmosphere of an argon-oxygen gas mixture, a black matter, called nodules, will appear on the surface of the target with the increase of integrated sputtering time. The black matter, which is considered to be a sub-oxide of indium, is formed on the periphery of the erosion race track of the target, and tends to cause arcing on sputtering and is known to be a source of particles in the formed thin film.

Consequently, during continuous sputtering, defects will be produced by the particles in the formed thin film, which lowers productivity of flat panel displays such as liquid crystal display. In recent years, flat panel displays are intended to be finer and more precise, so that the particles defect occurrence in the film is a serious problem.

In conventional production of the ITO thin film, the nodules formed on the target surface is periodically removed to prevent the occurrence of the defects in the thin film. Since this target cleaning operation lowers remarkably the productivity, an ITO target is required which is less liable to cause the nodule formation.

Many investigations are being made to prevent nodule formation on the ITO target. For example, sintering is conducted in a pressurized oxygen atmosphere of higher than one atmospheric pressure (Japanese Patent Publication 5-30905, etc.). The sintered ITO compact in this method has a remarkably high density of 7.06 g/cm$^3$. However, for the sintering under high pressure, the furnace should be placed entirely in pressure-tight vessel, which requires large and expensive production equipment, and a larger production apparatus cannot readily be provided, disadvantageously.

The sintered ITO target which has voids of an average diameter of 3–8 $\mu$m in a void density of not more than 1500 voids/mm$^2$ is known to cause extremely less occurrence of arcing, nodules, gas adsorption, etc. (Japanese Patent Laid-Open Publication 5-148636, etc.). This target, however, must be sintered in an oxygen atmosphere of not lower than one atmospheric pressure. Therefore, the same problem is involved on the larger size of the production apparatus.

In another method for retarding the nodule formation, powdery indium oxide and powdery tin oxide having respectively average diameter of not more than 0.1 $\mu$m is fired in an oxygen atmosphere at a temperature of 1350° C. or higher, and the resulting fired powdery matter is again crushed, and sintered in the non-oxygen at a temperature of from 500 to 1000° C. under a pressure of not lower than 100 kg/cm$^2$ to produce a sintered ITO compact causing arcing less (Japanese Patent Laid-Open Publication 4-160047, etc.).

The above method of production of a sintered ITO compact requires firing of a mixture of powdery starting materials, and subsequent crushing, molding and sintering. Therefore, the production process is complicated, and the production efficiency is low. Moreover, the sintered compact density is as low as about 94% in relative density, thus sufficient effect of increasing the sintered compact density being not readily achievable.

An object of the present invention is to provide a high-density ITO sputtering target which does not cause nodule formation on the target surface, thereby preventing defects in an ITO thin film formed by sputtering for uses such as transparent electrodes of flat panel display.

After comprehensive investigation to solve the above problem, it was found by the inventors of the present invention that the amount of the nodules is closely related to the number of arcing generated on the target surface during sputtering.

On the basis of the above findings, the inventors of the present invention investigated further the influence of voids in the interior of the sintered compact on the arcing frequency and the formation of nodules, and found the facts below:

(1) The arcing frequency and the amount of the formed nodules depend on length of the voids size in the sintered ITO compact, and a sintered ITO compact having average length of void size of not larger than 0.7 $\mu$m causes less arcing frequency and less formation of nodules.

(2) With the sintered ITO compact having average length of void size of not larger than 0.7 $\mu$m, the arcing frequency and the nodule formation are further decreased when the sintered compact has a density of not less than 7.08 g/cm$^3$, and/or a maximum length of void size of less than 5.0 $\mu$m (measured by the diameter method).

Further investigation was made by the inventors of the present invention on the sintered compacts of ITO which have various relative density to invenstigate the mechanism of sintering of ITO, and obtained the findings:

(1) Tin oxide segregates around the voids in the interior of the sintered compact.

(2) The size of the voids in the sintered compact depends on the size of segregated tin oxide, and the void diameter in the sintered compact decreasing with decrease of the size of segregates of tin oxide.

(3) Larger segregates of tin oxide are observed in the interior of a sintered ITO compact having a low sintering density, and the number of the larger tin oxide segregates decreases with increase of the sintering density.

(4) Sintered grain of extremely large grain size are observed in a sintered ITO compact of a low sintering density, which is considered to be caused by abnormal grain growth of ITO.

After further investigation, it was found by the inventors of the present invention:

(1) The density of a sintered ITO compact is remarkably increased by use of a mixed indium oxide powder, and tin oxide powder which has a maximum size of not larger than 1.0 μm and a median diameter of not larger than 0.4 μm as the starting materials.

(2) When the tap density of the mixed powder of the above Item (1) is less than 1.8 g/cm$^3$, the strength of the resulting green compact is lower, and may cause cracking of the green compact during sintering.

(3) The sintered density of the green compact composed of the above powder mixture is increased only by sintering in an oxygen atmosphere. The sintered density is much lower when the sintering is conducted in the air or a non-oxidizing atmosphere.

(4) The ITO sputtering target composed of a high-density sintered compact produced from the above mixed powder and having a sintered density of not less than 7.08 g/cm$^3$ prevents nodule formation significantly more effectively than a conventional target.

Experiments were further conducted on the basis of the above findings regarding the dependency of the sintered density and the voids in the interior of the sintered compact on the particle size of the tin oxide powder and the particle size of the indium oxide powder. It was found that a sintered ITO compact having a high sintered density can be obtained by use of starting materials of the particle diameters within certain ranges, and the resulting sintered compact is useful as a target for sputtering of an ITO thin film production. Consequently the present invention has been accomplished.

SUMMARY OF THE INVENTION

An object of the present invention is to provide a high-density ITO sputtering target which does not cause nodule formation on the target surface, thereby preventing defects in an ITO thin film formed by sputtering for uses such as transparent electrodes of flat panel display.

According to an aspect of the present invention, there is provided a sintered ITO compact substantially composed of indium, tin, and oxygen, having average length of void size of not more than 0.7 μm by a diameter method in a unit area on the surface thereof.

According to another aspect of the present invention, there is provided a process for producing sintered indium oxide-tin oxide (ITO) compact, comprising sintering, in an oxygen atmosphere, a green compact formed from a mixed powder of indium oxide powder and tin oxide powder, the mixed powder containing the tin oxide powder at a content ranging from 5% to 15%, the tin oxide powder having particles of a particle size of not more than 1 μm constituting not less than 90% portion thereof.

According to a further aspect of the present invention, there is provided a process for producing a sintered indium oxide-tin oxide (ITO) compact, comprising sintering, in an oxygen atmosphere, a green compact formed from a mixed powder of indium oxide powder and tin oxide powder, and the mixed powder having a tap density of not less than 1.8 g/cm$^3$, the tin oxide powder being composed of particles having a largest particle size of not more than 1 μm and a median diameter (a particle size corresponding to 50% of cumulative particle size distribution) of not larger than 0.4 μm.

According to a still further aspect of the present invention, there is provided a process for producing an ITO sputtering target from a sintered ITO compact, wherein the sintered ITO compact is produced by sintering, in an oxygen atmosphere, a green compact formed from a mixed powder of indium oxide powder and tin oxide powder, the mixed powder having a tap density of not less than 1.8 g/cm$^3$, and the tin oxide powder being composed of particles having a largest particle size of not more than 1 μm and a median diameter (a particle size corresponding to 50% of cumulative particle size distribution) of not larger than 0.4 μm.

DETAILED DESCRIPTION OF THE PREFERRED EMBODIMENT

The sintered ITO compact of the present invention is substantially composed of indium, tin, and oxygen, and has average length of void size of not more than 0.7 μm measured by a diameter method on the surface thereof.

The average length of void size is measured as below:

(1) A surface of a sintered ITO compact is mirror-polished by means of a rotary polisher, or the like (for example, polished successively with water resisting polishing paper of #220, #500, #800, and #1000) and alumina slurry.

(2) The polished surface of the sintered compact is subjected to a thermal etching treatment or a chemical etching treatment to reveal grain boundaries on the surface. The thermal etching treatment is conducted by heating the sintered compact at 1400° C. for 5 minutes in an electric furnace. The chemical etching treatment is conducted by immersing the sintered compact in aqua regia for a time ranging from 1 to 10 minutes at room temperature.

(3) The etched surface of the sintered compact is observed by a scanning electron microscope (SEM), and SEM photographs are taken at randomly selected 5 or more portions of the surface at magnification of about 1000 to about 5000.

(4) At least 200 voids are arbitarily picked up from the SEM photographs, and the sizes are measured by a diameter method. Here, the term "each size measured by a diameter method" means the largest length of each respective voids in the arbitarily same direction in the SEM photographs. The average length of the void size is derived by measuring the largest lengths in the same direction of each voids.

The average length of void size of the sintered ITO compact of the present invention is not larger than 0.7 μm. Preferably the average length of void size is not larger than 0.7 μm, and the largest void diameter is not more than 5.0 μm. The average length of void size is preferably as small as possible, and the lower limit thereof cannot be defined. Practically, however, the lower limit of the average void size is about 0.1 μm. The density of the sintered compact is preferably not less than 7.08 g/cm$^3$.

The above mentioned sintered ITO compact can be produced, for example, by the method shown below.

Generally, the sintered ITO compact is produced by sintering a mixture of indium oxide powder and tin oxide powder. The above mentioned sintered compact can be produced by using, as the one starting material, tin oxide powder containing particles of not more than 1 μm in diameter constituting not less than of 90% portion. Still higher density can be achieved by using indium oxide powder, as the other starting material, containing particles of not more than 1 μm in size constituting not less than of 90% portion.

In another method, a mixed tin oxide-indium oxide powder is used which has a tap density of not less than 1.8 g/cm$^3$, the tin oxide having a maximum particle size of not larger than 1 μm and a median size of not larger than 0.4 μm.

The median diameter herein means a particle size corresponding to 50% of cumulative particle size distribution. The particle size in the present invention means a secondary particle size, and the percentage of the particle size distribution is a volume percentage to the entire volume. The particle size distribution in the present invention was measured by means of "CAPA-300" (trade name, manufactured by Horiba Seisakusho), by centrifugal sedimentation (rotation speed: 2000 rpm) for particle size of less than 2 μm, and by gravimetric sedimentation for particle size of not less than 2 μm.

The tap density in the present invention is a physical property value of a powdery matter generally mentioned in powder technology, and is also called a closely pacted bulk density. The tap density is derived by filling the powder into a cylinder, tapping the cylinder to decrease the volume of the powder, and measuring the final volume and weight of the powder. The tapping width, and the tapping number of times are not specially limited provided that the tapping is conducted until the volume of the powder has become constant. For example, the tapping is repeated 500 times or more at a tapping width of 60 mm.

The powdery starting materials having the above properties can be prepared in a manner as follows. Tin oxide ($SnO_2$) powder is put into deionized water. The pH of the water is adjusted to be in the range of from 9.5 to 10.0 by addition of aqueous ammonia or the like. The tin oxide powder is dispersed in the water by agitation. For forming uniform dispersion of the powder in water, ultrasonic wave is preferably applied. The dispersion treatment is preferably continued for more than one hour for obtaining fine tin oxide powder particles. The pH is adjusted in the aforementioned range in order to obtain sufficient dispersion of the powder. The powder is preferably crushed for 10 hours or more using ball mill or the like before the dispersion treatment. Such crushing enables the preparation of fine particle component at a satisfactory yield.

The deionized water is used preferably in an amount of from 5% to 80% by weight of the powder. Thereby, the powder can be uniformly dispersed in the deionized water, and it can be obtained the fine particle component in a high yield.

After the dispersion treatment, the solution is left standing for a predetermined time to allow coarse particles to precipitate to the bottom of the vessel. Generally, particles dispersed in a solvent sedimentate at a velocity according to the Stokes' gravimetric sedimentation velocity equation shown below as a function of the particle diameter. The sedimentation velocity increases with the size of the particle.

$$Vi=0.03267\times((\rho_s-\rho_f)/\mu)\times Di^2$$

where Vi is precipitation velocity (mn/min) of a particle of diameter of Di; Di is the particle diameter (μm); $\rho_s$ is density of the particle (g/cm³); $\rho_f$ is density of the solvent (g/cm³); and μ is viscosity of the solvent (centipoise).

Therefore, the time (Ti) for a particle of diameter Di to precipitate from the liquid surface to a depth of L is represented by the equation: Ti=L/Vi. The particles having a diameter larger than Di precipitate at a velocity higher than Vi, so that at a lapse of time of Ti, the particles larger than Di are not present in the range of the liquid dispersion from the liquid surface to the depth L.

According to this theory, tin oxide powder having particles of a diameter of not more than 1 μm at a content not less than of 90% can be obtained by separating the solution above the depth L after a lapse of time Ti.

The method of decantation separation is not limited, and can be conducted by a conventional manner. The method includes separation of the desired portion of the solution by means of a micro-tube pump.

The dispersion liquid separated by decantation and containing the powder having desired particle diameters is subjected to drying by use of a rotary evaporator, a spray drier, or the like to remove water and ammonia to obtain the tin oxide powder as the starting tin oxide powder. If necessary, the dried powder may be again put into deionized water, and washed.

Indium oxide ($In_2O_3$) powder having the desired particle diameter can be prepared by treatment in the same manner as above.

The tin oxide powder and the indium oxide powder thus prepared are mixed by dry mixing or wet mixing with a ball mill or a like mixing apparatus. The mixture contains the tin oxide preferably at a content ranging from 5% to 15% by weight since specific resistance of an ITO thin film formed by sputtering is lowest within this range. The tin oxide powder or the indium oxide powder by the drying treatment may loosely agglomerate to form tertiary particles. Therefore, the mixing is preferably continued for 5 hours or more.

The resulting mixed powder is formed into an ITO green compact by pressing, slipcasting, or a like molding method. In press molding, the mixed powder is filled into a metal mold of a desired size, and is pressed at a pressure ranging from 100 to 300 kg/cm² by a pressing machine to form a green compact. A binder such as polyvinyl alcohol may be added thereto, if necessary. In slipcast, the mixed powder is mixed with water, dispersant and a binder to form a slurry having a viscosity ranging from 50 to 5000 centipoises, and the slurry is poured into a casting mold, and pressed at a pressure ranging from 3 to 25 kg/cm² to form a green compact.

The resulting green compact may further be treated for compuction by CIP if desired. The CIP treatment is conducted preferably at a pressure of not less than 2 tons/cm² to achieve sufficient compuction effect. The green compact formed by slipeasting is preferably treated, after the CIP, for drying and binder removal at a temperature of from 300 to 500° C. for a time of from 5 to 20 hours to remove water and an organic compound remaining in the green compact. The green compact formed by pressing by use of a binder is also preferably treated for binder removal in a similar manner.

Subsequently, the green compact thus prepared is sintered in a sintering furnace. The sintering may be conducted in an oxygen atmosphere substantially at an atmospheric pressure. Preferably, gaseous oxygen is introduced into the sintering furnace at a linear velocity of not less than 2.5 cm/min. The oxygen gas introduction enables the sufficient density increase. The temperature of the sintering is not lower than 1450° C. at which tin oxide is easy to be solid—soluled into indium oxide. The sintering temperature is preferably in the range of from 1450° C. to 1550° C. The keep time is preferably not shorter than 3 hours to achieve sufficient density increase effect.

Under the aforementioned conditions, the sintered ITO compact is produced which has an average length of void size of not more than 0.7 μm on the surface thereof, or which has an average length of void size of not more than 0.7 μm and a sintered density of not less than 7.08 g/cm³, and/or which has a maximum length of void size of not more than 5.0 μm.

Then the produced sintered ITO compact is machined into a desired target shape. The high-density sintered ITO compact has a higher hardness than conventional sintered ITO compacts. The machining is conducted preferably in a wet process to avoid cracking. The sputtering face may be mirror-polished, if necessary, by use of alumina slurry or a like material to eliminate fine scratches remaining on the surface after the wet machining.

The machined ITO compact is bonded to a backing plate made of oxygen-free copper or the like with an indium solder or the like solder to form a target.

The ITO sputtering target of the present invention prepared in such a manner exhibits remarkably the effect of prevention of nodule formation during sputtering.

The present invention is described in more detail by reference to examples without limiting the invention.

EXAMPLE 1

In a 3 L polyethylene pot, were placed 250 g of tin oxide powder in which 70% of the constituting tin oxide particles had particle size of not larger than 1 μm, and 3 kg of nylon balls of 15 mm in diameter having an iron core. The tin oxide powder was ball-milled for 60 hours.

The ball-milled tin oxide powder was put into 5000 g of deionized water in a 5 L polyethylene vessel. The pH of the dispersed medium was adjusted to 9.5 by addition of a small amount of aqueous ammonia. Then the dispersion liquid was treated for one hour by ultrasonic wave with stirring by a stirring blade.

After the dispersion treatment, a sample taken out of the dispersion liquid had a viscosity of 1.0 centipoise. The surface level of the dispersion liquid in the vessel was 250 mm high from the bottom. The sedimentation velocity of a tin oxide particle of 1.0 μm diameter was calculated to be 0.19 mm/min according the Stokes' equation.

In consideration of accumulation of powdery precipitate at the bottom of the vessel, the time for sedimentation of a tin oxide particle of 1.0 μm diameter to a depth of 180 mm from the liquid surface was calculated to be 15.5 hours. After standing for 15.5 hours, the portion of the dispersion liquid from the surface to the depth of 170 mm was separated by a micro-tube pump to avoid suction of particle size of larger than 1 μm in the separation. The separated dispersion liquid containing the tin oxide was dried by a rotary evaporator to obtain 73 g of powdery tin oxide powder. The particle size of the tin oxide powder was measured by a particle distribution analyzer, and found that particles size of 1 μm or less constituted 90% of the total volume.

40 Grams of this tin oxide powder, and 360 g of indium oxide powder in which 60% of the total volume had a particle diameter of not larger than 1 μm were mixed by means of a dry ball mill for 16 hours to prepare a mixed powder. This mixed powder was filled into a metal mold of 120 mm in diameter, and pressed at a pressure of 250 kg/cm² to form a green compact. This green compact was subjected to CIP treatment at a pressure of 3 tons/cm² to obtain a green compact having a density of 3.93 g/cm³.

This green compact was sintered in a pure oxygen atmosphere in a sintering furnace under the conditions shown below. The obtained sintered compact had a density of 7.06 g/cm³ according to an Archimedes' method.
(Sintering conditions)
Sintering temperature: 1500° C., temperature elevation rate: 25° C./hr, sintering time: 5 hours, oxygen linear velocity: 2.7 cm/min.

This sintered compact was machined into an article of 76.2 mm in diameter and 6 mm thick by a wet method. A rest piece of the machined compact obtained was used for observation of voids. A face of the rest piece was wet-polished with water-resisting polishing paper and alumina slurry to obtain a mirror surface. The polished face of this test piece was treated for thermal etching at 1400° C. for 5 minutes. The thermal etched surface was observed by SEM, and 20 microphotographs were taken at randomly selected portions at a magnification of 3500×. The each length of void size of the respective voids were measured by a diameter method by using the microphotographs. The average length of void size was 0.7 μm, and the maximum length of void size was 2.4 μm.

The machined ITO compact was bonded to a backing plate made of oxygen-free copper with an indium solder to form a target. With this target, continuous discharge test was conducted for sputtering under the sputtering conditions shown below. From the time of about 60 hours after the start of the test, nodules were found to form gradually in the vicinity of erosion race track, but the amount of the nodules was extremely little.
(Sputtering conditions)
DC power: 120 W (2.6 W/cm²), gas pressure: 0.5 Pa, argon gas flow rate: 50 SCCM, oxygen gas flow rate: 0.6 SCCM

EXAMPLE 2

In four 5 L polyethylene vessel, respectively, were placed 5000 g of deionized water and 250 g of indium oxide powder (1000 g in total) in which 60% of the constituting indium oxide particles had a particle size of not more than 1 μm. The pH of the dispersed medium was adjusted to 9.5 by addition of a small amount of aqueous ammonia. Then the dispersion liquid was treated for one hour by ultrasonic wave with stirring by a stirring blade.

After the dispersion treatment, a sample taken out of the dispersion liquid had a viscosity of 1.0 centipoise. The surface level of the dispersion liquid in the vessel was 250 mm high from the bottom. The sedimentation velocity of tin oxide particle of 1.0 μm diameter was calculated to be 0.20 mm/min according the Stokes' equation.

In consideration of accumulation of powdery precipitate at the bottom of the vessel, the time for sedimentation of an indium oxide particle of 1.0 μm diameter to a depth of 180 mm from the liquid surface was calculated to be 15.0 hours. After standing for 15.0 hours, the portion of the dispersion liquid from the surface to the depth of 170 mm was separated by a micro-tube pump, in consideration of suction of particle size of diameter of larger than 1 μm during the separation. The separated dispersion liquid containing the indium oxide was dried by a rotary evaporator to obtain 380 g of indium oxide powder. The particle size of the indium oxide powder was measured by a particle distribution analyzer, and found that particle size of 1 μm or less constituted 90% of the total volume.

Separately, in a 3 L polyethylene pot, were placed 250 g of tin oxide powder in which 70% of the constituting tin oxide particles had particle size of not larger than 1 μm, and 3 kg of nylon balls of 15 mm diameter having an iron core. The tin oxide powder was ball-milled for 72 hours.

The ball-milled tin oxide powder was put into 5000 g of deionized water in a 5 L polyethylene vessel. The pH of the dispersed medium was adjusted to 9.5 by addition of a small amount of aqueous ammonia. Then the dispersion liquid was treated for one hour by ultrasonic wave with stirring by a stirring blade.

After the dispersion treatment, a sample taken out of the dipersion liquid had a viscosity of 1.0 centipoise. The surface level of the dispersion liquid in the vessel was 250 mm high from the bottom. The sedimentation velocity of tin oxide particle of 0.5 μm diameter was calculated to be 0.05 mm/min according the Stokes' equation.

In consideration of accumulation of powdery sedimentation at the bottom of the vessel, the time for precipitation of a tin oxide particle of 0.5 μm diameter to a depth of 140 mm from the liquid surface was calculated to be 46.7 hours. After standing for 46.7 hours, the portion of the dispersion liquid from the surface to the depth of 135 mm was separated by a micro-tube pump to avoid suction of particle size of larger than 0.5 μm during the separation. The separated dispersion liquid containing the tin oxide was dried by a rotary evaporator to obtain 60 g of tin oxide powder. The particle size of the tin oxide powder was measured by a particle distribution analyzer, and found that all the particles had a diameter of 1 μm or less.

360 Grams of the obtained indium oxide powder, and 40 g of the obtained tin oxide powder were mixed and ball-milled in a dry state for 16 hours to prepare a powder mixture. This mixed powder was filled into a metal mold of 120 mm in diameter, and pressed at a pressure of 250 kg/cm$^2$ to form a green compact. This green compact was subjected to CIP treatment at a pressure of 3 tons/cm$^3$ to obtain a green compact having a density of 3.92 g/cm$^3$. This green compact was sintered in a pure oxygen atmosphere in a sintering furnace under the conditions shown below. The obtained sintered compact had a density of 7.12 g/cm$^3$ according to an Archimedes' method.

(Sintering conditions)

Sintering temperature: 1500° C., temperature elevation rate: 25° C./hr, sintering time: 10 hours, oxygen linear velocity: 3.0 cm/min.

This sintered compact was machined into an article of 76.2 mm in diameter and 6 mm thick by a wet method. A rest piece of the machined compact obtained was used for observation of voids. This polished face of the rest piece was wet-polished to obtain a mirror surface. This surface of the test piece was treated for thermal etching at 1400° C. for 5 minutes. Thermal etched surface was observed by SEM, and 20 microphotographs were taken at randomly selected sites at a magnification of 3500× in the same manner as in Example 1. The each length of voil size of the respective voids were measured by a diameter method by using the microphotographs. The average length of void size was 0.6 μm, and the maximum length of void size was 1.7 μm.

The machined sintered ITO compact was bonded to a backing plate made of oxygen-free copper with an indium solder to form a target.

With this target, continuous discharge test was conducted for sputtering under the same sputtering conditions as in Example 1. No nodule was formed until the end of the life of the target.

COMPARATIVE EXAMPLE 1

40 Grams of tin oxide powder in which 70% of the constituting particles had a particle size of not larger than 1 μm, and 360 g of indium oxide in which 60% of the constituting particles had a size of not larger than 1 μm were mixed by a ball mill in a dry state under the same conditions as in Example 1 to prepare a mixed powder. The mixed powder was press-molded, and treated for CIP under the same conditions as in Example 1 to prepare a green compact. The resulting green compact had a density of 3.94 g/cm$^3$. This green compact was sintered in the same sintering conditions as in Example 1 to prepare a sintered ITO compact.

The resulting sintered compact had a density of 6.97 g/cm$^3$ according to an Archimedes' method. This sintered compact was machined into an article of 76.2 mm in diameter and 6 mm thick by a wet method. The machined ITO compact was bonded to a backing plate made of oxygen-free copper with an indium solder to form a target. A rest piece of the compact obtained during the working was used for observation of voids. A face of the rest piece was mirror-polished, and was treated for thermal etching at 1400° C. for 5 minutes. Thermal etched surface was observed by SEM, and 20 microphotographs were taken at randomly selected portions at a magnification of 3500× in the same manner as in Example 1. The each length of void size of the respective voids were measured by a diameter method by using the microphotographs. The average length of void size was 0.8 μm, and the maximum length of void size was 14 μm.

With this target, continuous discharge test was conducted for sputtering under the same sputtering conditions as in Example 1. From the time of about 30 hours after the start of the use of the target, nodules were found to form gradually in the vicinity of erosion race track.

EXAMPLE 3

In a 3 L polyethylene pot, were placed 250 g of tin oxide powder in which 70% of the constituting tin oxide particles had a particle size of not larger than 1 μm, and 3 kg of nylon balls of 15 mm in diameter having an iron core. The tin oxide powder was ball-milled for 72 hours.

The ball-milled tin oxide powder was put into 5000 g of deionized water in a 5 L polyethylene vessel. The pH of the dispersed medium was adjusted to 9.5 by addition of a small amount of aqueous ammonia. Then the dispersion liquid was treated for one hour by ultrasonic wave with stirring by a stirring blade.

After the dispersion treatment, a sample taken out of the dispersion liquid had a viscosity of 1 centipoise. The surface level of the dispersion liquid in the vessel was 250 mm high from the bottom. The sedimentation velocity of tin oxide particle of 0.8 μm diameter was calculated to be 0.124 mm/min according the Stokes' equation.

In consideration of accumulation of powdery precipitate at the bottom of the vessel, the time for sedimentation of a tin oxide particle of 0.8 μm diameter to a depth of 160 mm from the liquid surface was calculated to be 21.5 hours. After standing for 21.5 hours, the portion of the dispersion liquid from the surface to the depth of 160 mm was separated by a micro-tube pump.

The separated dispersion liquid containing the tin oxide powder was dried by a rotary evaporator to obtain 89 g of tin oxide powder. The particle size of the tin oxide powder was measured by a particle distribution analyzer, and found that particles size of 1 μm or less constituted 92% of the total volume, and particles of diameter of 0.5 μm or less constituted 78% thereof.

40 Grams of this tin oxide powder, and 360 g of indium oxide powder in which 61% of the constituting particles had a particle diameter of not larger than 1 μm were mixed by a dry ball mill for 16 hours to prepare a mixed powder. This mixed powder was filled into a metal mold of 120 mm diameter, and pressed at a pressure of 250 kg/cm$^2$ to form a green compact. This green compact was subjected to CIP treatment at a pressure of 3 tons/cm$^2$ to obtain a green compact having a density of 3.91 g/cm. This green compact was wintered in a pure oxygen atmosphere in a wintering furnace under the conditions shown below. The obtained wintered compact had a density of 7.09 g/cm³ according to an Archimedes' method.

(Sintering conditions)

Sintering temperature: 1500° C., temperature elevation rate: 25° C./hr, sintering time: 6 hours, oxygen linear velocity: 2.8 cm/min.

This wintered compact was machined into an article of 76.2 mm in diameter and 6 mm thick by a wet method. The machined ITO compact was bonded to a backing plate made of oxygen-free copper with an indium solder to form a target. With this target, continuous discharge test was conducted for sputtering under the sputtering conditions shown below.

(Sputtering conditions)

DC power: 120 W (2.6 W/cm²), gas pressure: 0.5 Pa, argon gas flow rate: 50 SCCM, oxygen gas flow rate: 0.6 SCCM As the results of the continuous sputtering test, no nodule was formed until the end of the life of the target.

EXAMPLE 4

In a 3 L polyethylene pot, were placed 250 g of tin oxide powder in which 71% of the constituting tin oxide particles had a size of not larger than 1 µm, and 3 kg of nylon balls of 15 mm diameter having an iron core. The tin oxide powder was ball-milled for 72 hours.

The ball-milled tin oxide powder was put into 5000 g of deionized water in a 5 L polyethylene vessel. The pH of the despersed medium was adjusted to 9.5 by addition of a small amount of aqueous ammonia. Then the dispersion liquid was treated for one hour by ultrasonic wave with stirring by a stirring blade.

After the dispersion treatment, a sample taken out of the dispersion liquid had a viscosity of 1 centipoise. The surface level of the dispersion liquid in the vessel was 250 mm high from the bottom. The sedimentation velocity of tin oxide particle of 0.4 µm diameter was calculated to be 0.031 mm/min according the Stokes' equation. In consideration of accumulation of powdery precipitate at the bottom of the vessel, the time for sedimentation of a tin oxide particle of 0.4 µm diameter to a depth of 130 mm from the liquid surface was calculated to be 69.9 hours.

After standing for 69.9 hours, the portion of the dispersion liquid from the surface to the depth of 130 mm was separated by a micro-tube pump. The separated dispersion liquid containing the tin oxide powder was dried by a rotary evaporator to obtain 55 g of tin oxide powder. The particle size of the tin oxide powder was measured by a particle distribution analyzer, and found that particles size of 1.0 µm or less constituted 98% of the total volume, and particles size of 0.5 µm or less constituted 92% thereof.

40 Grams of this tin oxide powder, and 360 g of indium oxide powder in which 60% of the constituting particles had a particle diameter of not larger than 1 µm were mixed by a dry ball mill for 16 hours to prepare a mixed powder. This mixed powder was filled into a metal mold of 120 mm diameter, and pressed at a pressure of 250 kg/cm² to form a green compact. This green compact was subjected to CIP treatment at a pressure of 3 tons/cm² to obtain a green compact having a density of 3.93 g/cm³. This green compact article was sintered in a pure oxygen atmosphere in a sintering furnace under the conditions shown below. The resulting sintered compact had a density of 7.13 g/cm³ according to an Archimedes' method.

(Sintering conditions)

Sintering temperature: 1500° C., temperature elevation rate: 25° C./hr, Wintering time: 6 hours, oxygen linear velocity: 2.8 cm/min.

This sintered compact was machined into an article of 76.2 mm in diameter and 6 mm thick by a wet method. The machined ITO compact was bonded to a backing plate made of oxygen-free copper with an indium solder to form a target. With this target, continuous discharge test was conducted for sputtering under the same sputtering conditions as in Example 1. As the results of the continuous sputtering test, no nodule was formed until the end of the life of the target.

EXAMPLE 5

In four 5 L polyethylene vessel, respectively, were placed 5000 g of deionized water and 250 g of indium oxide powder (1000 g in total) in which 60% of the constituting indium oxide particles had a particle size of not more than 1 µm. The pH of the dispersed medium was adjusted to 9.5 by addition of a small amount of aqueous ammonia. Then the dispersion liquid was treated for one hour by of ultrasonic wave with stirring by a stirring blade.

After the dispersion treatment, a sample taken out of the dispersion liquid had a viscosity of 1 centipoise. The surface level of the dispersion liquid in the vessel was 250 mm high from the bottom. The sedimentation velocity of tin oxide particle of 1.2 µm diameter was calculated to be 0.291 mm/min according the Stokes' equation for sedimentation velocity. In consideration of accumulation of powdery precipitate at the bottom of the vessel, the time for precipitation of an indium oxide particle of 1.2 µm diameter to a depth of 180 mm from the liquid surface was calculated to be 10.3 hours. After standing for 10.3 hours, the portion of the dispersion liquid from the surface to the depth of 180 mm was separated by a micro-tube pump.

The separated dispersion liquid containing the indium oxide was dried by a rotary evaporator to obtain 406 g of indium oxide powder. The particle size of the tin oxide powder was measured by a particle size distribution analyzer, and found that particles of size of 1.0 µm or less constituted 91% of the total volume.

Separately, tin oxide powder was prepared in the same manner as in Example 4, in which particles size of 1 µm or less constituted 98% of the tin oxide, and particles size of 0.5 µm or less constituted 92% thereof.

360 Grams of the above obtained indium oxide powder, and 40 g of the obtained tin oxide powder were mixed and ball-milled in a dry state for 16 hours to prepare a mixed powder. This mixed powdery was filled into a metal mold of 120 mm in diameter, and pressed at a pressure of 250 kg/cm² to form a green compact. This green compact was subjected to CIP treatment at a pressure of 3 tons/cm² to obtain a green compact having a density of 3.93 g/cm³. This green compact was sintered in a pure oxygen atmosphere in a sintering furnace under the conditions shown below. The obtained sintered compact had a density of 7.14 g/cm³ according to an Archimedes' method.

(Sintering conditions)

Sintering temperature: 1500° C., temperature elevation rate: 25° C./hr, sintering time: 6 hours, oxygen linear velocity: 2.8 cm/min.

This sintered compact was machined into an article of 76.2 mm in diameter and 6 mm thick by a wet method. The machined ITO compact was bonded to a backing plate made of oxygen-free copper with an indium solder to form a target. With this target, continuous discharge test was conducted for sputtering under the same sputtering conditions as in Example 1. No nodule was formed until the end of the life of the target.

EXAMPLE 6

In a 3 L polyethylene pot, were placed 250 g of tin oxide powder which was constituted of particles of a largest particle size of 9.0 μm and a median size of 1.9 μm, and 3 kg of nylon balls of 15 mm in diameter having an iron core. The tin oxide powder was ball-milled for 48 hours.

The ball-milled tin oxide powder was put into 5000 g of deionized water in a 5 L polyethylene vessel. The pH of the dispersed medium was adjusted to 9.5 by addition of a small amount of aqueous ammonia. Then the dispersion liquid was treated for one hour by ultrasonic wave with stirring by a stirring blade.

After the dispersion treatment, a sample taken out of the dispersion liquid had a viscosity of 1 centipoise. The surface level of the dispersion liquid in the vessel was 250 mm high from the bottom. The sedimentation velocity of tin oxide particle of 1.0 μm in diameter was calculated to be 0.194 mm/min according the Stokes' equation. In consideration of accumulation of powdery precipitate at the bottom of the vessel, the time for sedimentation of a tin oxide particle of 1.0 μm in diameter to a depth of 180 mm from the liquid surface was calculated to be 15.5 hours. After standing for 15.5 hours, the portion of the dispersion liquid from the surface to the depth of 180 mm was separated by a micro-tube pump. The separated dispersion liquid containing the tin oxide powder was dried by a rotary evaporator to obtain 106 g of tin oxide powder. The particle size of the tin oxide powder was measured by a particle distribution analyzer, and found that particles had a largest particle size of 1.0 μm and a median diameter of 0.4 μm.

40 Grams of this tin oxide powder, and 360 g of indium oxide powder which had a largest particle size of 3.6 μm and a median diameter of 0.7 μm were mixed by a dry ball mill for 16 hours to prepare a mixed powder. This mixed powder had a tap density of 2.04 g/cm$^3$.

This mixed powder was filled into a metal mold of 120 mm in diameter, and pressed at a pressure of 250 kg/cm$^2$ to form a green compact. This green compact article was subjected to CIP treatment at a pressure of 3 tons/cm$^2$ to obtain a green compact having a density of 3.93 g/cm$^3$. This green compact was sintered in a pure oxygen atmosphere in a sintering furnace under the conditions shown below. The obtaining sintered compact had a density of 7.08 g/cm$^3$ according to an Archimedes' method.

(Sintering conditions)

Sintering temperature: 1500° C., temperature elevation rate: 25° C./hr, sintering time: 5 hours, oxygen linear velocity: 2.7 cm/min.

This sintered compact was machined into an article of 76.2 mm in diameter and 6 mm thick by a wet method. The machined ITO compact was bonded to a backing plate made of oxygen-free copper with an indium solder to form a target.

With this target, continuous discharge test was conducted for sputtering under the sputtering conditions shown below. As the results of the continuous sputtering test, no nodule was formed until the end of the life of the target.

(Sputtering conditions)

DC power: 120 W (2.6 W/cm$^2$), gas pressure: 0.5 Pa, argon gas flow rate: 50 SCCM, oxygen gas flow rate: 0.6 SCCM

EXAMPLE 7

In a 3 L polyethylene pot, were placed 250 g of tin oxide powder which was constituted of particles of a largest particle size of 9.0 μm and a median size of 1.9 μm, and 3 kg of nylon balls of 15 mm in diameter having an iron core. The tin oxide powder was ball-milled for 48 hours.

The ball-milled tin oxide powder was put into 5000 g of deionized water in a 5 L polyethylene vessel. The pH of the dispersed medium was adjusted to 9.5 by addition of a small amount of aqueous ammonia. Then the dispersion liquid was treated for dispersion for one hour by application of ultrasonic wave with stirring by a stirring blade. After the dispersion treatment, a sample taken out of the dispersion liquid had a viscosity of 1 centipoise. The surface level of the dispersion liquid in the vessel was 250 mm high from the bottom.

The sedimentation velocity of tin oxide particle of 0.5 μm in diameter was calculated to be 0.048 mm/min according the Stokes' equation. In consideration of accumulation of powdery precipitate at the bottom of the vessel, the time for sedimentation of a tin oxide particle of 0.5 μm in diameter to a depth of 180 mm from the liquid surface was calculated to be 62.5 hours. After standing for 62.5 hours, the portion of the dispersion liquid from the surface to the depth of 180 mm was separated by a micro-tube pump.

The separated dispersion liquid containing the tin oxide powder was dried by a rotary evaporator to obtain 63 g of tin oxide powder. The particle size of the tin oxide powder was measured by a particle distribution analyzer, and found that particles had a largest particle size of 0.5 μm and a median diameter of 0.3 μm.

40 Grams of this tin oxide powder, and 360 g of indium oxide powder which had a largest particle size of 3.6 μm and a median diameter of 0.7 μm were mixed by a ball mill in a dry state for 16 hours to prepare a mixed powder. This mixed powder mixture had a tap density of 2.06 g/cm$^3$.

This mixed powder was filled into a metal mold of 120 mm in diameter, and pressed at a pressure of 250 kg/cm$^2$ to form a green compact. This green compact was subjected to CIP treatment at a pressure of 3 tons/cm$^2$ to obtain a green compact having a density of 3.93 g/cm$^3$. This green compact was sintered in a pure oxygen atmosphere in a sintering furnace under the conditions shown below. The resulting sintered compact had a density of 7.12 g/cm$^3$ according to an Archimedes' method.

(Sintering conditions)

Sintering temperature: 1500° C., temperature elevation rate: 50° C./hr, sintering time: 5 hours, oxygen linear velocity: 2.7 cm/min.

This sintered compact was machined into an article of 76.2 mm in diameter and 6 mm thick by a wet method. The machined ITO compact was bonded to a backing plate made of oxygen-free copper with an indium solder to form a target.

With this target, continuous discharge test was conducted for sputtering under the same sputtering conditions as in Example 1. As the results of the continuous sputtering test, no nodule was formed until the end of the life of the target.

COMPARATIVE EXAMPLE 2

40 Grams of tin oxide powder which was constituted of particles of a largest particle size of 9.0 μm and a median diameter of 1.9 μm, and 360 g of indium oxide which had a largest particle size of 4.2 μm and a median diameter of 0.6 μm were mixed by a ball mill in a dry state under the same conditions as in Example 1 to prepare a mixed powder, and press-molded and treated for CIP under the same conditions as in Example 1 to prepare a green compact. The resulting green compact had a density of 3.92 g/cm$^3$. This green compact was sintered in the same sintering conditions as in Example 1 to prepare a sintered ITO compact.

The resulting sintered compact had a density of 6.86 g/cm$^3$ according to an Archimedes' method. This sintered compact was machined into an article of 76.2 mm in diameter and 6 mm thick by a wet method. The machined ITO compact was bonded to a backing plate made of oxygen-free copper with an indium solder to form a target. With this target, continuous discharge test was conducted for sputtering under the same sputtering conditions as in Example 1. From the time of about 30 hours after the start of the use of the target, nodules were found to form gradually in the vicinity of erosion race track.

COMPARATIVE EXAMPLE 3

40 Grams of tin oxide powder which was prepared in the same manner as in Example 6 and was constituted of particles of a largest particle size of 1.0 μm and a median diameter of 0.4 μm, and 360 g of indium oxide which was constituted of particles of a largest particle size of 3.6 μm and a median diameter of 0.7 μm were mixed by a ball mill for 10 minutes to prepare a mixed powder. The resulting mixed powder had a tap density of 1.7 g/cm$^3$. This mixed powder was press-molded and CIP-treated to obtain a green compact. The resulting green compact had a density of 3.93 g/cm$^3$. This green compact was sintered under the same sintering conditions as in Example 1. The obtained sintered compact had cracks.

The sintered ITO compact of the present invention has controlled average diameter of void size, and a high density of not lower than 7.08 g/cm$^3$. The ITO sputtering target constituted of this sintered compact causes no nodule formation during sputtering, and prevents particle generation during sputtering. It can improve strikingly the yield in LCD production.

What is claimed is:

1. A process for producing a sintered ITO compact, comprising sintering, in an oxygen atmosphere, a green compact formed from a mixed powder of indium oxide powder and tin oxide powder, the mixed powder having a tap density of not less than 1.8 g/cm$^3$, and the tin oxide powder composed of particles having a largest particle size of not more than 1 μm and a median diameter (a particle diameter corresponding to 50% of cumulative particle diameter distribution) of not larger than 0.4 μm.

2. A process for producing an ITO sputtering target from a sintered ITO compact, wherein the sintered ITO compact is produced by sintering, in an oxygen atmosphere, a green compact article formed from a mixed powder of indium oxide powder and tin oxide powder, the mixed powder having a tap density of not less than 1.8 g/cm$^3$, and the tin oxide powder being composed of particles having a largest particle size of not more than 1 μm and a median diameter (a particle diameter corresponding to 50% of cumulative particle diameter distribution) of not larger than 0.4 μm.

* * * * *